United States Patent
Clark

(10) Patent No.: US 6,926,840 B2
(45) Date of Patent: Aug. 9, 2005

(54) FLEXIBLE FRAME FOR MOUNTING A DEPOSITION MASK

(75) Inventor: Thomas K. Clark, Walworth, NY (US)

(73) Assignee: Eastman Kodak Company, Rochester, NY (US)

( * ) Notice: Subject to any disclaimer, the term of this patent is extended or adjusted under 35 U.S.C. 154(b) by 250 days.

(21) Appl. No.: 10/334,956

(22) Filed: Dec. 31, 2002

(65) Prior Publication Data
US 2004/0123799 A1 Jul. 1, 2004

(51) Int. Cl.⁷ .............................................. B44C 1/22
(52) U.S. Cl. .......................... 216/12; 216/40; 216/54; 438/141; 438/237; 438/780
(58) Field of Search .............................. 216/12, 40, 54; 438/141, 237, 780; 156/280

(56) References Cited

U.S. PATENT DOCUMENTS

| 5,661,371 A | * | 8/1997 | Salerno et al. | ........... 315/169.3 |
| 5,945,238 A | * | 8/1999 | Huggins et al. | ............... 430/5 |
| 6,146,489 A | * | 11/2000 | Wirth | ........................ 156/280 |
| 6,475,287 B1 | | 11/2002 | Clark | |
| 6,703,172 B2 | * | 3/2004 | Fujita et al. | .................... 430/5 |
| 6,703,328 B2 | * | 3/2004 | Tanaka et al. | ............... 438/462 |

FOREIGN PATENT DOCUMENTS

| JP | 55091972 | 7/1980 |
| JP | 11243274 | 9/1999 |
| WO | WO99/54786 | 10/1999 |

* cited by examiner

Primary Examiner—Nadine G. Norton
Assistant Examiner—Binh X. Tran
(74) Attorney, Agent, or Firm—Raymond L. Owens

(57) ABSTRACT

A method of mounting a deposition mask onto a flexible frame for use in vacuum deposition of material through a pealable deposition mask in forming an OLED, including the steps of providing a plate with the pealable deposition mask formed thereon; providing the flexible frame having border portions, such border portions defining a frame opening which corresponds to border portions on the pealable deposition mask; aligning and then securing the border portions of the flexible frame to the border portions of the pealable deposition mask and removing the flexible frame and secured pealable deposition mask from the plate; and mounting the flexible frame with the pealable deposition mask in a carrier which maintains planarity of the pealable deposition mask during subsequent vacuum deposition of material.

5 Claims, 2 Drawing Sheets

FLEXIBLE FRAME FOR MOUNTING A DEPOSITION MASK

FIELD OF THE INVENTION

The present invention relates to the deposition of organic material through a deposition mask onto a substrate in the process of making an organic light emitting diode (OLED)

BACKGROUND OF THE INVENTION

While shadow masks have been manufactured and used for deposition of materials in industry for an extended period of time applications for the pealable deposition masks used in active matrix organic light emitting devices (OLED) require greater precision and accuracy than previous manufacturing applications required.

A process used to manufacture a pealable deposition mask forms a pealable deposition mask onto a plate. The pealable deposition mask is a electroformed on the plate using a metallic compound, which is then chemically etched using a patterned photo-resist. The pealable deposition mask is then manually removed from the plate. The process of removal includes pealing the pealable deposition mask from the plate by first lifting a corner and drawing the electroformed material way from the plate. The process is as consistent as the manual process can be performed person to person. The pealable deposition masks are thin maliable material making them susceptible to deformation. The pealable deposition mask after removal has structural deformation and curl due to the directional draw of the peeling process. The pealable deposition mask is also affected by inconsistent peeling direction and the any change in the angle the pealable deposition mask is peeled away from the plate.

The pealable deposition mask must be now mounted to a frame used in the deposition process. The pealable deposition mask is presently mounted to the frame manually using a alignment device (commonly-assigned U.S. Pat. No. 6,475,287 B1). The pealable deposition mask must first be manually aligned to the frame. Next, the pealable deposition mask is held as planer as possible using an alignment plate. The alignment plate attempts to hold the already curled and structurally deformed pealable deposition mask as flat as possible while the process of manually applying adhesive strips to the outer edge of the pealable deposition mask and the deposition frame simultaneously, attaching the pealable deposition mask to the frame. When individual adhesive strips are applied directional stresses are introduced into the pealable deposition mask. The directional stresses cause rippling or waves in the mounted pealable deposition mask. The rippling is detrimental to the deposition process. The pealable deposition mask must be as co-planer as possible to the substrate during the deposition process for accurate deposition of materials.

In making organic light emitting devices (OLED) there are a number of steps in which organic layers are deposited on or over a substrate. It is essential that pealable deposition mask be aligned and properly mounted so that accurate deposition takes place. The pealable deposition mask is typically a precision mask made of a thin malleable material. The pealable deposition mask is lithographically patterned and because it is thin it permits the appropriate location of organic material to be deposited on or over the substrate. The pealable deposition mask has to be properly mounted and the aligned to the substrate. The following is a description of a standard technique used to mount and align the pealable deposition mask. The prior art typically uses a frame and manually centers the mask relative to the frame. Tape is often used to secure the pealable deposition mask to the frame. The frame with the mounted pealable deposition mask is positioned in a vacuum chamber relative to the substrate.

SUMMARY OF THE INVENTION

It is an object of the present invention to provide an improved way for removal of a pealable deposition mask from the plate while minimizing ripple in the pealable deposition mask after its removal from the plate.

This object is achieved in a method of mounting a deposition mask onto a flexible frame for use in vacuum deposition of material through a pealable deposition mask in forming an OLED, comprising the steps of:

(a) providing a plate with the pealable deposition mask formed thereon;

(b) providing the flexible frame having border portions, such border portions defining a frame opening which corresponds to border portions on the pealable deposition mask;

(c) aligning and then securing the border portions of the flexible frame to the border portions of the pealable deposition mask and removing the flexible frame and secured pealable deposition mask from the plate; and (d) mounting the flexible frame with the pealable deposition mask in a carrier which maintains planarity of the pealable deposition mask during subsequent vacuum deposition of material.

It is an advantage of the present invention that rippling of a pealable deposition mask when mounted on a frame has been minimized.

A further advantage is to facilitate an effective way for mounting a pealable deposition mask onto a frame carrier by adhesively securing the frame to the pealable deposition mask prior to its removal from the plate.

BRIEF DESCRIPTION OF THE DRAWINGS

FIG. 3 depicts a flexible frame during removal of the pealable deposition mask from a plate.

DESCRIPTION OF THE PREFERRED EMBODIMENTS

Figure 1:
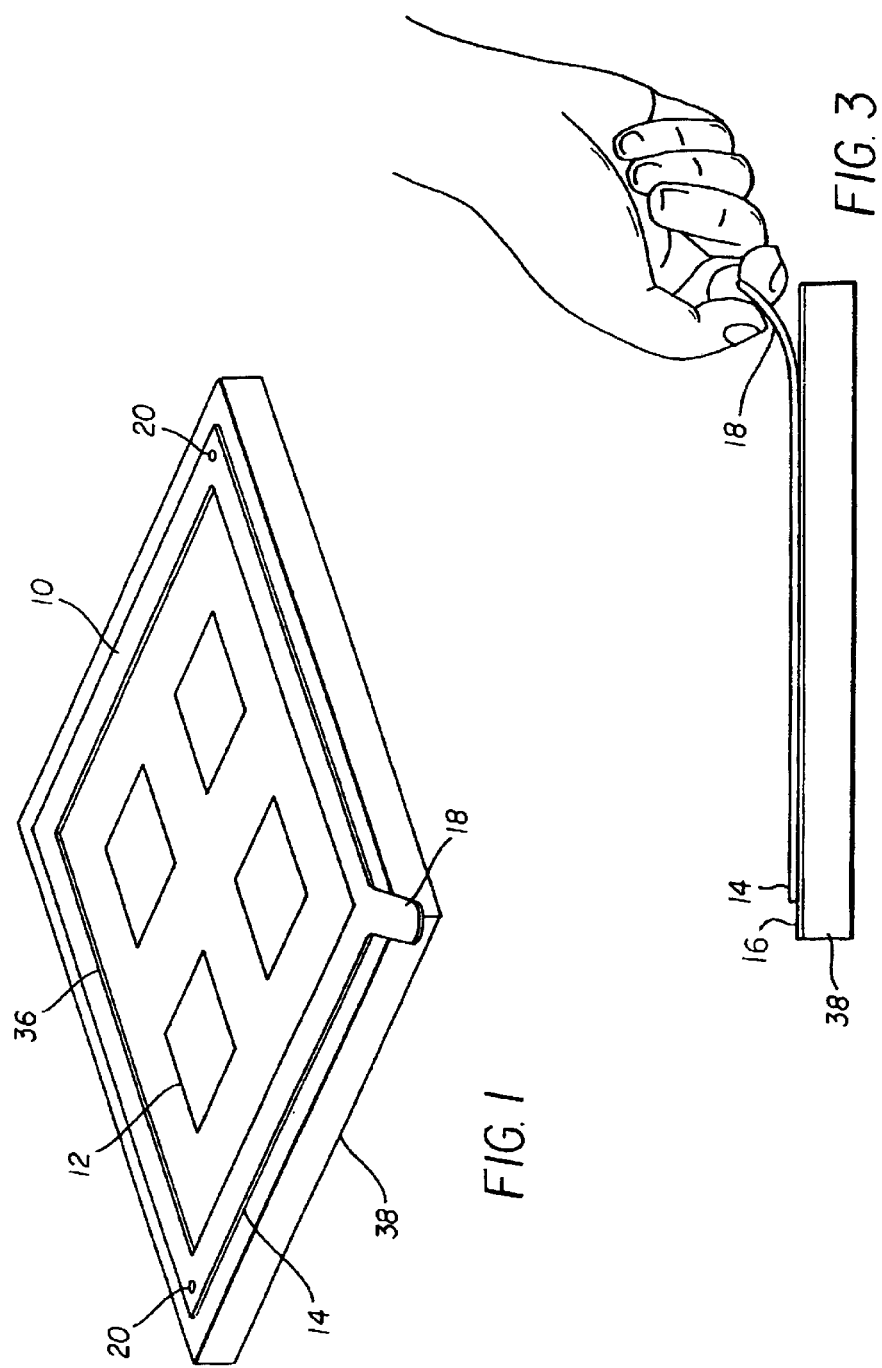
FIG. 1 is an isometric of a flexible frame on a plate prior to removal.
Figure 2:
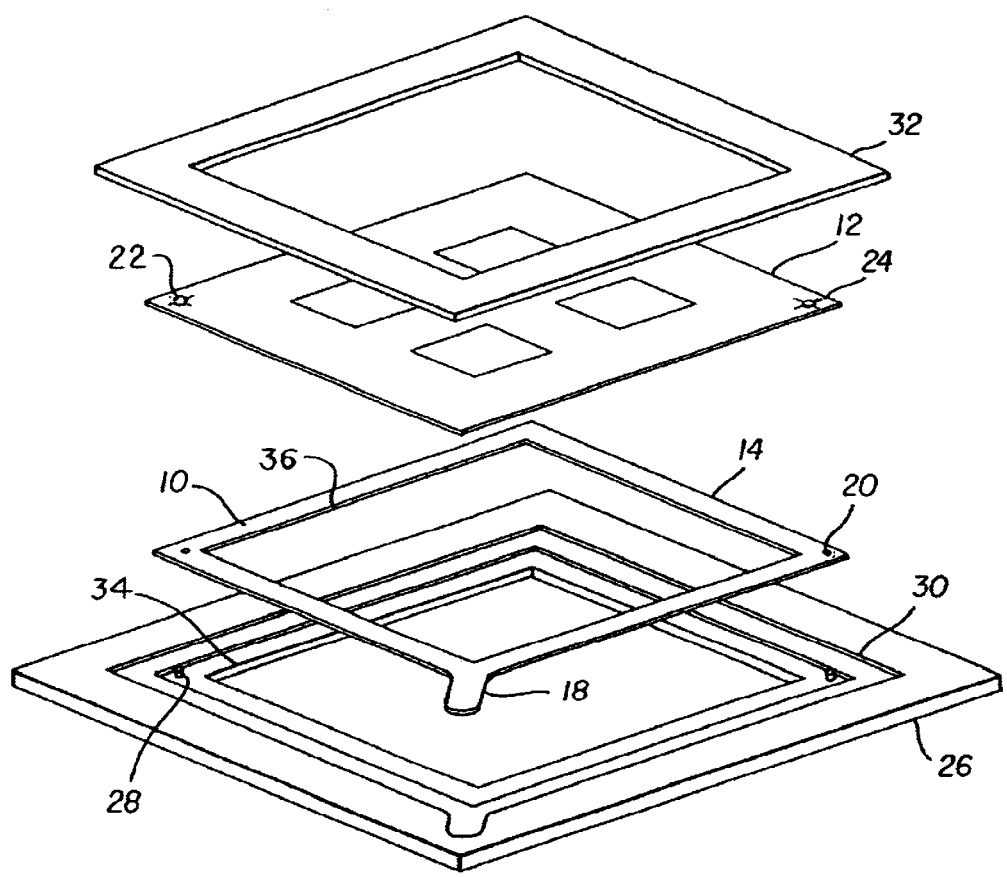
FIG. 2 is an exploded view of a flexible frame and carrier for pealable deposition mask in accordance with the present invention.

FIG. 1 is an isometric of a flexible frame 14 having border portions 10 preferably made of aluminum having a central rectangular opening 36 required to permit the deposition of organic materials. Located at one outside corner of the rectangular shaped flexible frame 14 is a grip tab 18. Depicted in FIG. 1 in two locations at opposing corners of flexible frame 14 there are locator holes 20. The locator holes 20 serve a duel purpose. As depicted in FIG. 1 the locator holes 20 function as visual alignment holes for the purpose of manually aligning the flexible frame 14 to an alignment target 24 located at opposing corners of the pealable deposition mask 12. The present invention aligns and secures the border portions 10 of the flexible frame 14 to the border portions of pealable deposition mask This facilitates the removal of the flexible frame 14 and secured pealable deposition mask 12 from the plate 38. FIG. 2 corresponding to the locator holes 20 in the flexible frame 14. A plate 38 which the pealable deposition mask 12 is electroformed and a pealable deposition mask 12.

FIG. 2 depicts an exploded view of a flexible frame 14 having a pealable deposition mask 12 adhesively attached and mounted in a carrier 26. A pealable deposition mask 12 having alignment holes 22 and a target 24 in the form of marks on which a flexible frame 14 is mounted by means of an adhesive layer 16 (see FIG. 3). The flexible frame 14 having a grip tab 18 to facilitate the removal of the pealable deposition mask 12 to be discussed in detail in FIG. 3. The flexible frame 14 having locator holes 20 are depicted in opposing corners that are used for aligning the pealable deposition mask 12. The pealable deposition mask 12 having an alignment target 24 located in opposing corners of the pealable deposition mask 12 correspond with the alignment holes 22 in the flexible frame 14. The exploded view also depicts a carrier 26 having two pins 28 located in opposing corners of a central pocket 30 that are in alignment with the locator holes 20 in flexible frame 14. The central pocket 30 is configured in a pattern that accepts a flexible frame 14 having a clearance allowance on the perimeter as to not restrict thermal expansion. The carrier 26 is depicted having a opening 34 which is in a central location in the carrier 26 bordering pocket 30. This mounting arrangement maintains planarity of the pealable deposition mask 12 during subsequent vacuum deposition of material. Additionally depicted is a keeper 32 which provides a method of sandwiching the flexible frame 14 having the adhesive layer 16 and the pealable deposition mask 12 planar to carrier 26 in manner that does not restrict lateral movement caused by thermal expansion. Thermal expansion occurs during the deposition process. It is understood in the deposition of organic materials through a pealable deposition mask while forming an organic materials through a pealable disposition mask while forming an organic light emitting diodes (OLED) that the temperature differential occurs.

FIG. 3 depicts the process of removing the pealable deposition mask 12 from the plate 38 using the grip tab 18 located on flexible frame 14 to lift and peel the pealable deposition mask 12 from the plate 38 by manually lifting the grip tab 18 which will flex the flexible frame 14 in a manner that peels the pealable deposition mask 12 from the plate 38. The process of removal is complete and the flexible frame 14 with the pealable deposition mask 12 adhesively attached can now be mounted in carrier 30.

The invention has been described in detail with particular reference to certain preferred embodiments thereof, but it will be understood that variations and modifications can be effected within the spirit and scope of the invention.

PARTS LIST

10 border portions
12 pealable deposition mask
14 flexible frame
16 adhesive layer
18 grip tab
20 locator hole
22 alignment hole
24 alignment target
26 carrier
28 pin
30 central pocket
32 keeper
34 opening
36 central rectangular opening
38 plate

What is claimed is:

1. A method of mounting a deposition mask onto a flexible frame for use in vacuum deposition of material through a pealable deposition mask in forming an light-emitting diode, comprising the steps of:

(a) providing a plate with the pealable deposition mask formed thereon;

(b) providing the flexible frame having border portions, the border portions defining a frame opening which corresponds to border portions on the pealable deposition mask;

(c) aligning and then securing the border portions of the flexible frame to the border portions of the pealable deposition mask and removing the flexible frame and secured pealable deposition mask from the plate; and (d) mounting the flexible frame with the pealable deposition mask in a carrier which maintains planarity of the pealable deposition mask during subsequent vacuum deposition of material.

2. The method of claim 1 further including providing a grip tab on the flexible frame which facilitates a user in removal of the flexible frame and secured pealable deposition mask.

3. The method of claim 1 wherein the pealable deposition mask is formed with alignment targets and the flexible frame includes alignment holes corresponding to the targets on the pealable deposition mask to facilitate alignment.

4. The method of claim 1 wherein the material is organic.

5. The method of claim 1 further providing a keeper which sandwiches the flexible frame with the pealable deposition mask in the carrier.

\* \* \* \* \*